United States Patent
Matsushita et al.

(10) Patent No.: US 8,295,318 B2
(45) Date of Patent: Oct. 23, 2012

(54) VERTICAL CAVITY SURFACE EMITTING LASER, VERTICAL-CAVITY-SURFACE-EMITTING-LASER DEVICE, OPTICAL TRANSMISSION APPARATUS, AND INFORMATION PROCESSING APPARATUS

(75) Inventors: Kazuyuki Matsushita, Kanagawa (JP); Takashi Kondo, Kanagawa (JP); Kazutaka Takeda, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/906,514

(22) Filed: Oct. 18, 2010

(65) Prior Publication Data

US 2011/0317540 A1 Dec. 29, 2011

(30) Foreign Application Priority Data

Jun. 29, 2010 (JP) .................................. 2010-147095

(51) Int. Cl.
*H01S 3/04* (2006.01)
*H01S 5/00* (2006.01)
(52) U.S. Cl. .................................................. 372/43.01
(58) Field of Classification Search ............... 372/43.01
See application file for complete search history.

(56) References Cited

U.S. PATENT DOCUMENTS

| 7,580,438 | B2 | 8/2009 | Mochizuki |
| 2003/0026308 | A1* | 2/2003 | Iwai et al. ................... 372/46 |

FOREIGN PATENT DOCUMENTS

| JP | A-2001-156395 | | 6/2001 |
| JP | A-2002-359432 | | 12/2002 |
| JP | 2004063657 A | * | 2/2004 |
| JP | A-2004-63657 | | 2/2004 |
| JP | A-2006-210429 | | 8/2006 |

\* cited by examiner

*Primary Examiner* — Patrick Stafford
(74) *Attorney, Agent, or Firm* — Oliff & Berridge, PLC (57) ABSTRACT

A vertical cavity surface emitting laser including a substrate, a first semiconductor multilayer film reflector formed on the substrate, an active region formed on the first semiconductor multilayer film reflector, a second semiconductor multilayer film reflector formed on the active region, an electrode formed on the second semiconductor multilayer film reflector, a light absorption layer, and a light transmission layer. In the electrode, a light emitting aperture is formed. The light absorption layer is formed in a peripheral region of the light emitting aperture, and absorbs emitted light. The light transmission layer is composed of a material which the emitted light can pass through, and formed in a central region of the light emitting aperture. Thicknesses of the light absorption layer and the light transmission layer are selected so that phases of light from the light absorption layer and from the light transmission layer are adjusted.

12 Claims, 10 Drawing Sheets

A-A CROSS SECTION

FIG. 1

A-A CROSS SECTION

λ: 780 nm, n2 : 3.6 (FIXED VALUE)

| n1 | d1(nm, a=0) | d2(nm, b=0) | d2(nm, b=1) | d2(nm, b=2) |
|---|---|---|---|---|
| ZERO | — | — | 300 | 600 |
| 1.5 | 260 | 50 | 350 | 650 |
| 2.0 | 195 | 75 | 375 | 675 |
| 2.5 | 156 | 90 | 390 | 690 |

VERTICAL CAVITY SURFACE EMITTING LASER, VERTICAL-CAVITY-SURFACE-EMITTING-LASER DEVICE, OPTICAL TRANSMISSION APPARATUS, AND INFORMATION PROCESSING APPARATUS

CROSS-REFERENCE TO RELATED APPLICATIONS

This application is based on and claims priority under 35 USC 119 from Japanese Patent Application No. 2010-147095 filed Jun. 29, 2010.

BACKGROUND (i) Technical Field

The present invention relates to a vertical cavity surface emitting laser, a vertical-cavity-surface-emitting-laser device, an optical transmission apparatus, and an information processing apparatus.

(ii) Related Art

Vertical cavity surface emitting lasers (VCSELs) are utilized as light sources of communication apparatuses or of image forming apparatuses. VCSELs that are utilized as such light sources are required to generate single (fundamental) transverse-mode oscillation, to have high optical power, and to have a long life. In VCSELs of a selective oxidation type, the oxidation aperture diameter of a current confinement layer is reduced to about 2 to 3 μm so that single transverse-mode oscillation is generated. When such a small oxidation aperture diameter is used, it is difficult to obtain an optical power of 3 mW or higher with stability.

SUMMARY

According to a first aspect of the invention, there is provided a vertical cavity surface emitting laser including a substrate, a first semiconductor multilayer film reflector of a first conductivity type, an active region, a second semiconductor multilayer film reflector of a second conductivity type, an electrode, a light absorption layer, and a light transmission layer. The first semiconductor multilayer film reflector is formed on the substrate. The active region is formed on the first semiconductor multilayer film reflector. The second conductivity type is a conductivity type different from the first conductivity type. The second semiconductor multilayer film reflector is formed on the active region. The electrode is formed on the second semiconductor multilayer film reflector. In the electrode, a light emitting aperture from which light is emitted is formed. The light absorption layer is formed in at least a peripheral region of the light emitting aperture of the electrode, and absorbs light having an emission wavelength. The light transmission layer is composed of a material which the light having the emission wavelength is able to pass through, and is formed in a central region of the light emitting aperture of the electrode. A thickness of the light absorption layer and a thickness of the light transmission layer are selected so that a phase of light which emanates from the light absorption layer and a phase of light which emanates from the light transmission layer are adjusted.

BRIEF DESCRIPTION OF THE DRAWINGS

Exemplary embodiments of the present invention will be described in detail based on the following figures, wherein.

DETAILED DESCRIPTION

Next, exemplary embodiments of the present invention will be described with reference to the accompanying drawings. In the description given below, vertical cavity surface emitting lasers of a selective oxidation type are provided by way of examples, and referred to as "VCSELs". It should be noted that, the scale of devices and apparatuses in the figures is enhanced in order to easily understand the features of the invention, and is not necessarily the same as the scale of the devices and apparatuses in reality.

Exemplary Embodiments

Figure 1:
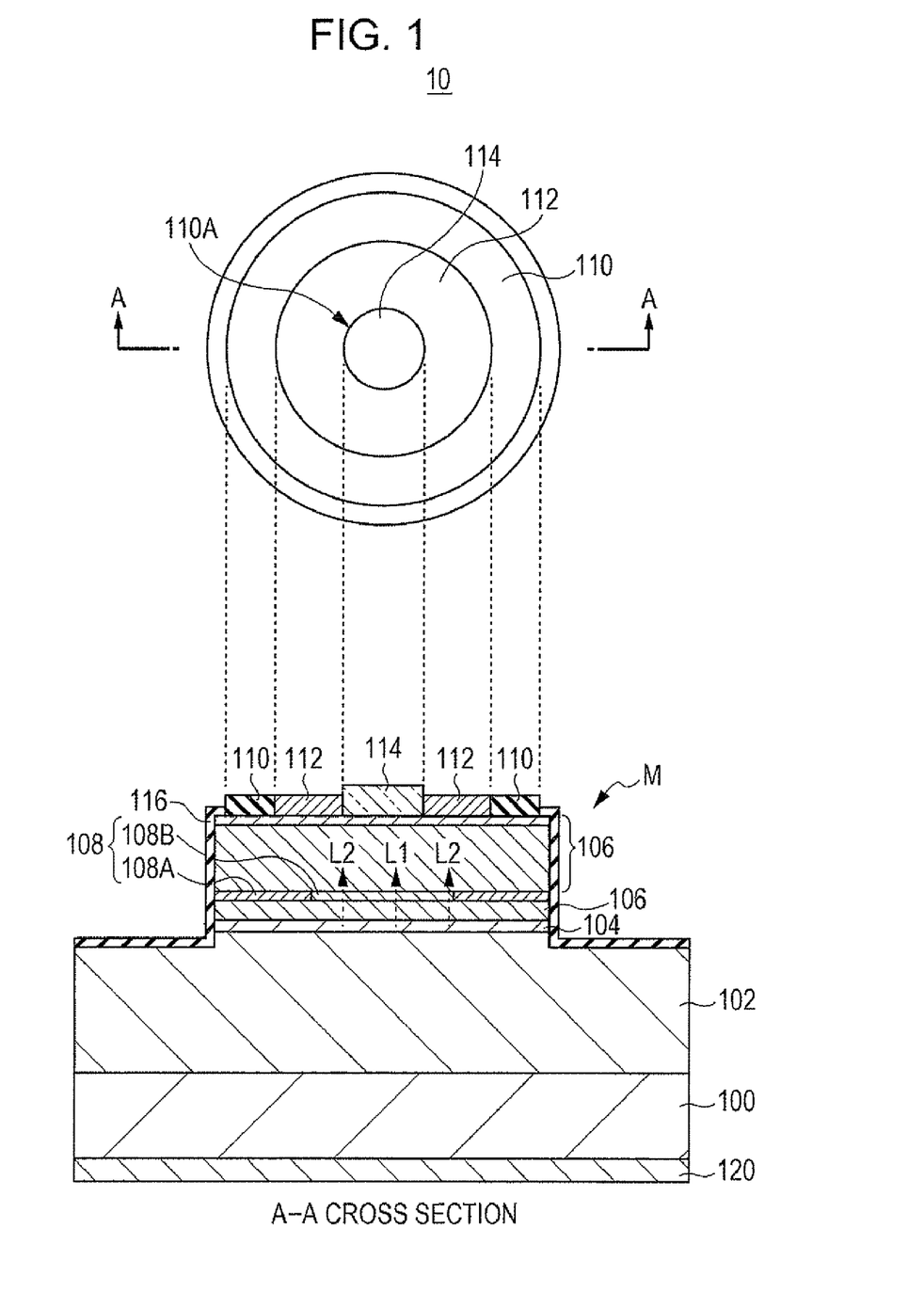
FIG. 1 includes a plan view of a VCSEL according to a first exemplary embodiment of the present invention and a cross-sectional view taken along the line A-A in the plan view.

FIG. 1 is a schematic cross-sectional view of a VCSEL according to a first exemplary embodiment of the present invention. As illustrated in FIG. 1, a VCSEL 10 according to the present exemplary embodiment is configured so that an n-type lower distributed bragg reflector (DBR) 102, an active region 104, and a p-type upper DBR 106 are stacked on an n-type GaAs substrate 100. In the lower DBR 102, AlGaAs layers having different aluminum contents are alternately stacked. The active region 104 is formed on the lower DBR 102, and includes a quantum well layer that is sandwiched between upper and lower spacer layers. The upper DBR 106 is formed on the active region 104, and, in the upper DBR 106, AlGaAs layers having different aluminum contents are alternately stacked.

The n-type lower DBR 102 is configured so that high-refractive-index layers and low-refractive-index layers are stacked. For example, multiple pairs of an $Al_{0.9}Ga_{0.1}As$ layer and an $Al_{0.3}Ga_{0.7}As$ layer are stacked. The thickness of each $Al_{0.9}Ga_{0.1}As$ layer or $Al_{0.3}Ga_{0.7}As$ layer is $\lambda/4n_r$ (where $\lambda$ is an emission wavelength and $n_r$ is a refractive index of a medium). The $Al_{0.9}Ga_{0.1}As$ layer and the $Al_{0.3}Ga_{0.7}As$ layer are alternately stacked forty times. The carrier concentration of each of the $Al_{0.9}Ga_{0.1}As$ layers and $Al_{0.3}Ga_{0.7}As$ layers that have been doped with silicon which is an n-type impurity is, for example, $3\times10^{18}$ cm$^{-3}$.

The lower spacer layer of the active region 104 is an undoped $Al_{0.6}Ga_{0.4}As$ layer. The quantum well layer includes an undoped $Al_{0.11}Ga_{0.89}As$ quantum well layer and an undoped $Al_{0.3}Ga_{0.7}As$ barrier layer. The upper spacer layer is an undoped $Al_{0.6}Ga_{0.4}As$ layer.

The p-type upper DBR 106 is configured so that high-refractive-index layers and low-refractive-index layers are stacked. For example, multiple pairs of an $Al_{0.9}Ga_{0.1}As$ layer and an $Al_{0.3}Ga_{0.7}As$ layer are stacked. The thickness of each $Al_{0.9}Ga_{0.1}As$ layer or $Al_{0.3}Ga_{0.7}As$ layer is $\lambda/4n_r$. The $Al_{0.9}Ga_{0.1}As$ layer and the $Al_{0.3}Ga_{0.7}As$ layer are alternately stacked twenty-four times. The carrier concentration of each of the $Al_{0.9}Ga_{0.1}As$ layers and $Al_{0.3}Ga_{0.7}As$ layers that have been doped with carbon which is a p-type impurity is, for example, $3\times10^{18}$ cm$^{-3}$. Furthermore, a contact layer 106A that is composed of p-type GaAs and that has a high impurity concentration (for example, $1\times10^{19}$ cm$^{-3}$) is formed as the top layer of the upper DBR 106. A current confinement layer 108 that is composed of p-type AlAs is formed as the bottom layer of the upper DBR 106 or formed inside the upper DBR 106.

Semiconductor layers starting with the upper DBR 106 ending with the lower DBR 102 are etched, thereby forming a mesa (a columnar structure) M having a cylindrical shape on the substrate 100. The current confinement layer 108 is exposed on the side face of the mesa M, and includes an oxidized region 108A which is selectively oxidized from the side face, and an electrically conductive region (oxidized aperture) 108B around which the oxidized region 108A is formed. In a process of oxidizing the current confinement layer 108, an oxidation rate at which an AlAs layer is oxidized is higher than an oxidation rate at which an AlGaAs layer is oxidized. Oxidization progresses at a substantially fixed speed in a direction from the side face to the inside of the mesa M. Accordingly, the shape of a cross-section plane, which exists in a plane parallel to the principal plane of the substrate 100, of the electrically conductive region 108B is a circular shape in which the outer shape of the mesa M is reflected. The center of the electrically conductive region 108B coincides with the center of the mesa M in an axis direction, i.e., with an optical axis. The size of the diameter of the current confinement layer 108 may be a size of a diameter with which high-order transverse-mode oscillation can be generated, and may be, for example, 5 μm or larger for an emission wavelength band of 780 nm.

A metallic ring-shaped p-side electrode 110 is formed as the top layer of the mesa M. The p-side electrode 110 is composed of, for example, a metallic material that is obtained by stacking Au, Ti/Au, or the like. The p-side electrode 110 is in ohmic contact with the contact layer 106A of the upper DBR 106. An opening having a circular shape is formed at the center of the p-side electrode 110, and the opening defines a light emitting aperture 110A from which light is emitted. The center of the light emitting aperture 110A coincides with the optical axis of the mesa M, and the diameter of the light emitting aperture 110A is larger than the diameter of the electrically conductive region 108B.

In a peripheral region of the light emitting aperture 110A, a ring-shaped light absorption layer 112 is formed. The light absorption layer 112 is composed of a material (fundamental absorption) having an energy gap Eg that is smaller than light emission energy of laser light having the emission wavelength, or a material that can absorb light using impurities or defects. As an example of the former, a semiconductor material such as undoped InP or InAs is used. As an example of the latter, a semiconductor material that has been doped with an impurity so that the semiconductor material has a high impurity concentration is used. Light can be absorbed by a resin material, instead of by one of the semiconductor materials given above. Here, the peripheral region in which the light absorption layer 112 is formed is a region including a position at which optical power generated by high-order transverse-mode oscillation peaks and not including a position at which optical power generated by fundamental transverse-mode oscillation peaks. Accordingly, the ring-shaped light absorption layer 112 absorbs light L2 that is generated by high-order transverse-mode oscillation at positions distant from the optical axis.

In a central region of the light emitting aperture 110A, a phase adjustment layer 114 is formed. Here, the central region in which the phase adjustment layer 114 is formed is a region including a position at which the optical power generated by fundamental transverse-mode oscillation peaks. The phase adjustment layer 114 adjusts the phase of light that is extracted from the peripheral region and the phase of light that is extracted from the central region, and selects a refractive index, thereby setting a reflectivity of the central region. In order that light L1 which is generated by fundamental transverse-mode oscillation in the vicinity of the optical axis pass through the phase adjustment layer 114, the phase adjustment layer 114 is composed of a material having an energy gap Eg that is larger than light emission energy. For example, the phase adjustment layer 114 may be configured using a dielectric layer that is composed of an oxide, a nitride, or the like, such as SiN, $SiO_2$, SiON, or $TiO_2$, or using an electrically conductive layer composed of, for example, ITO. In the example illustrated in FIG. 1, the phase adjustment layer 114 is formed on the contact layer 106A that is exposed through the opening of the light absorption layer 112. The center of the phase adjustment layer 114 coincides with the optical axis, and the diameter of the phase adjustment layer 114 is equal to or smaller than the diameter of the electrically conductive region 108B.

An interlayer insulating film 116 is formed so as to cover the bottom portion of the mesa M, the side portion of the mesa M, and the periphery of the top portion of the mesa M. The interlayer insulating film 116 is composed of, for example, SiN or $SiO_2$. Furthermore, an n-side electrode 120 is formed on the rear face of the substrate 100, and electrically connected to the lower DBR 102.

When a forward drive current is applied to the p-side electrode 110 and the n-side electrode 120, laser oscillation is generated in a vertical cavity, which includes the lower DBR 102, the active region 104, and the upper DBR 106, in a direction that is substantially perpendicular to the substrate 100. The light L1 is generated by fundamental transverse-mode oscillation in the vicinity of the optical axis. The light L2 is generated by high-order transverse-mode oscillation at positions that are distant from the optical axis in the horizontal direction. Because the light absorption layer 112 is formed in the peripheral region of the light emitting aperture 110A, one portion of or most of the light L2 that is generated by high-order transverse-mode oscillation is absorbed by the light absorption layer 112, thereby reducing high-order transverse-mode oscillation. Furthermore, the central region and the peripheral region are included in an emission region, and the light which emanates from the central region and the light which emanates from the peripheral region are adjusted by the phase adjustment layer 114 so that the light which emanates from the central region and the light which emanates from the peripheral region have the same phase. Accordingly, the light that has high optical power and that has characteristics of an FFP indicating an excellent unimodal distribution can be obtained by fundamental transverse-mode oscillation.

In a typical configuration of the related art, in which high-order transverse-mode oscillation is reduced using a reflectivity, it is necessary to consider a reflectivity and a phase difference in each of a high-order transverse-mode oscillation portion and a fundamental transverse-mode oscillation portion. When the phase difference is adjusted, the reflectivity also simultaneously changes. Accordingly, it is impossible to separately set the reflectivity and the phase difference to optimum values.

In contrast, in the present exemplary embodiment, because absorption of light is utilized as a method for reducing high-order transverse-mode oscillation, it is only necessary to consider the reflectivity of the central region (which influences fundamental transverse-mode oscillation) of the emission region. Accordingly, parameters for the light absorption layer and parameters for the phase adjustment layer are appropriately selected, whereby a reflectivity and a phase difference can be controlled separately from each other. Thus, reduction in high-order transverse-mode oscillation and excellent characteristics of an FFP can be simultaneously achieved. Furthermore, because the diameter of the electrically conductive region 108B of the current confinement layer 108 can be larger than a diameter that is used to generate fundamental transverse-mode oscillation, this contributes to high optical power.

Figure 2:
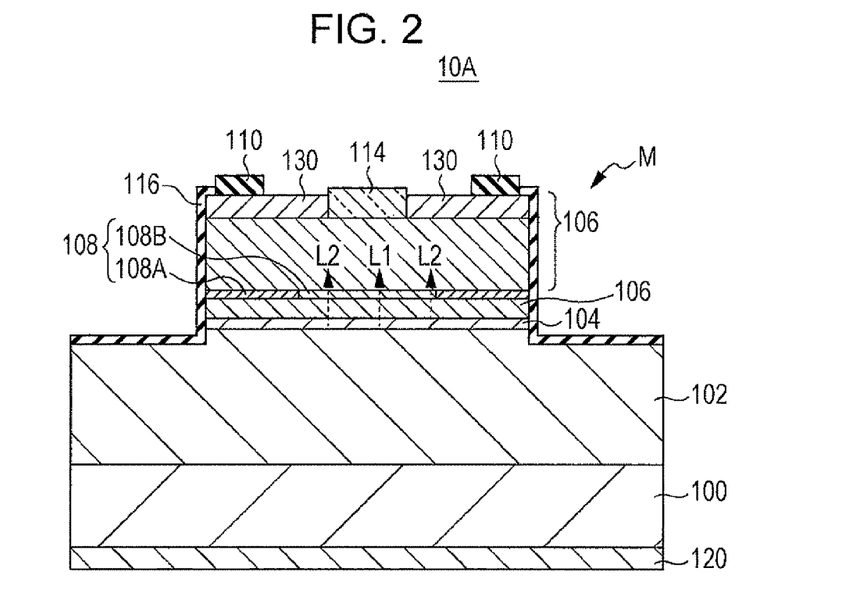
FIG. 2 is a cross-sectional view illustrating a configuration of a VCSEL according to a second exemplary embodiment of the present invention.

FIG. 2 is a cross-sectional view illustrating a configuration of a VCSEL according to a second exemplary embodiment of the present invention. A VCSEL 10A according to the second exemplary embodiment is a VCSEL that utilizes, as a light absorption layer, a contact layer that is formed as the top layer of the upper DBR 106. The configuration associated with the other elements is the same as the configuration in the first exemplary embodiment. As illustrated in FIG. 2, the contact layer formed as the top layer of the upper DBR 106 also functions as a light absorption layer 130. The contact layer, i.e., the light absorption layer 130, is made to have a predetermined thickness in order to realize phase matching between the light absorption layer 130 and the phase adjustment layer 114. However, a portion of the light absorption layer 130 in a central region of a light emitting aperture is removed by etching or the like, and the phase adjustment layer 114 is formed in a space corresponding to the removed portion of the light absorption layer 130. The light absorption layer 130 also functions as a contract layer as described above. Accordingly, the light absorption layer 130 is doped with an amount of impurities that is sufficient to make an ohmic contact between the light absorption layer 130 and the p-side electrode 110. The degree of absorption of light increases with an increase in the impurity concentration of the light absorption layer 130. As described above, in the second exemplary embodiment, the light L2 generated by high-order transverse-mode oscillation is absorbed by the light absorption layer 130 also serving as a contact layer.

Figure 3:
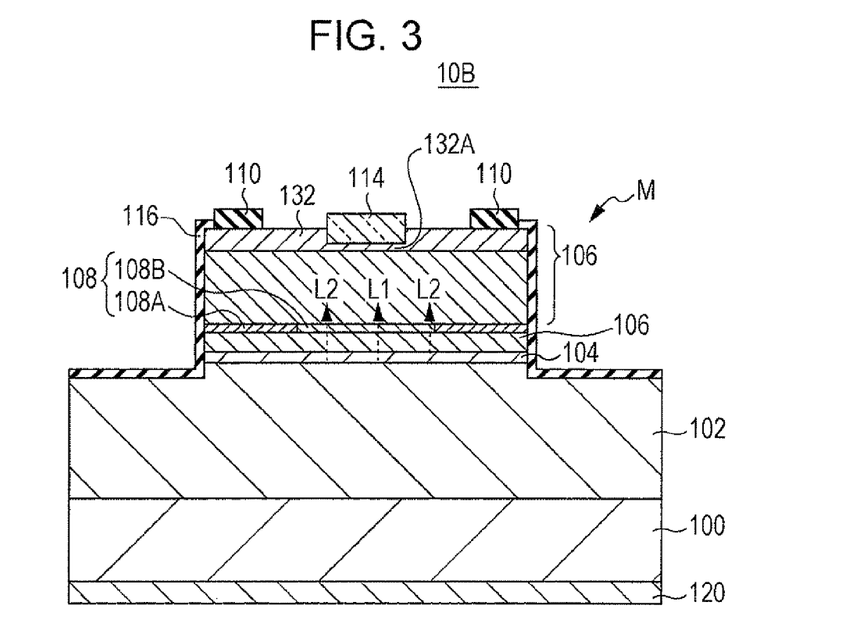
FIG. 3 is a cross-sectional view illustrating a configuration of a VCSEL according to a third exemplary embodiment of the present invention.

FIG. 3 is a cross-sectional view illustrating a configuration of a VCSEL according to a third exemplary embodiment of the present invention. A VCSEL 10B according to the third exemplary embodiment is a VCSEL that is obtained by modifying one portion of the light absorption layer of the VCSEL 10A according to the second exemplary embodiment. As illustrated in FIG. 3, a light absorption layer 132 functioning as a contact layer is formed as the top layer of the upper DBR 106. In the second exemplary embodiment, no contact layer exists immediately below the phase adjustment layer 114. However, in the third exemplary embodiment, a contact layer 132A is formed as one portion of the light absorption layer 132 although the contact layer 132A has a very small thickness. The contact layer 132A is used to inject, into the upper DBR 106, a current that has been mainly supplied from the p-side electrode 110. Because the contact layer 132A is made to remain at the center of a mesa, a current flowing into the active region 104 can be made uniform, and reduction of a threshold current and high optical power can be achieved.

Figure 4:
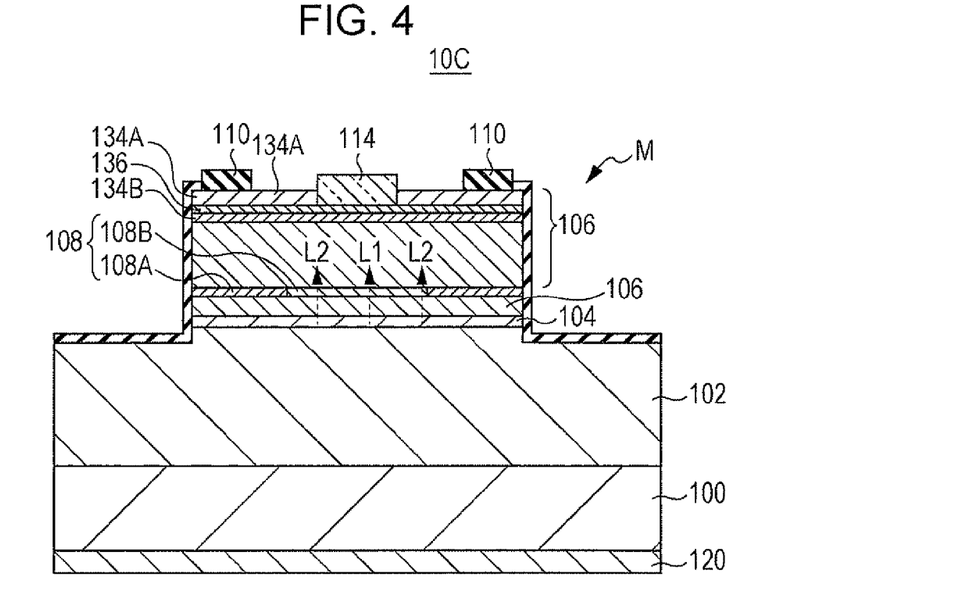
FIG. 4 is a cross-sectional view illustrating a configuration of a VCSEL according to a fourth exemplary embodiment of the present invention.

FIG. 4 is a cross-sectional view illustrating a configuration of a VCSEL according to a fourth exemplary embodiment of the present invention. In a VCSEL 10C according to the fourth exemplary embodiment, an etching stopper layer 136 is formed between light absorption layers 134A and 134B that also serve as contact layers. When etching of one portion of the light absorption layer 134A is performed, etching with high accuracy is required. For this reason, an etchant etches GaAs that the light absorption layer 134A is composed of, and an etching stopper layer 136 that is composed of a material (for example, GaInP) which has an etching selectivity with respect to the etchant is inserted between the light absorption layers 134A and 134B. Accordingly, when the light absorption layer 134A is etched, etching can be stopped by the etching stopper layer 136. Note that, when no light absorption layer is made to remain immediately below the phase adjustment layer 114 as in the second exemplary embodiment, an etching stopper layer is formed below the light absorption layer 130.

Figure 5:
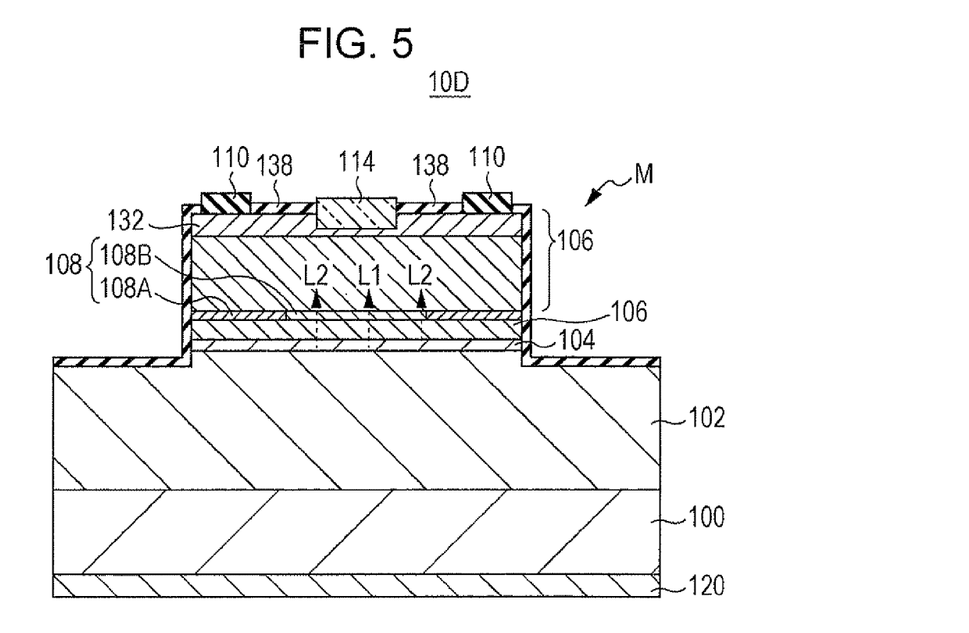
FIG. 5 is a cross-sectional view illustrating a configuration of a VCSEL according to a fifth exemplary embodiment of the present invention.

FIG. 5 is a cross-sectional view illustrating a configuration of a VCSEL according to a fifth exemplary embodiment of the present invention. A VCSEL 10D according to the fifth exemplary embodiment is a VCSEL that is obtained by forming a protective film 138, which covers the light absorption layer 132, on the surface of the VCSEL 10B according to the third exemplary embodiment. The protective film 138 can be composed of the same material that the interlayer insulating film 116 is composed of. Accordingly, the light absorption layer 132 is protected from moisture or humidity. In this case, because the protective film 138 is formed on the light absorption layer 132, the thickness of the light absorption layer 132 is set in consideration with an influence to a phase of light passing through the protective film 138.

Figure 6:
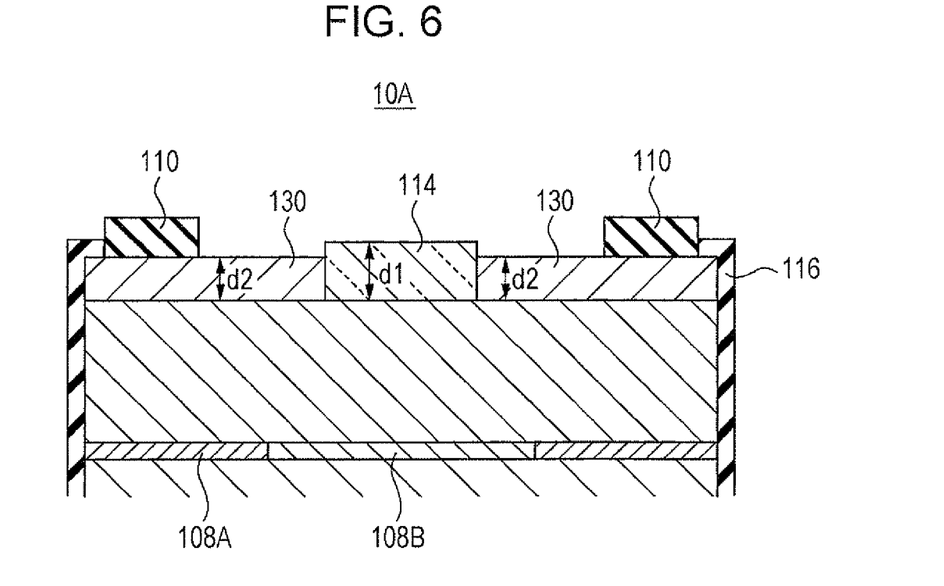
FIG. 6 is a schematic diagram in which a top portion of a mesa of the VCSEL according to the second exemplary embodiment of the present invention is enlarged.

Next, a method for selecting preferable thicknesses of a phase adjustment layer and a light absorption layer will be described. FIG. 6 is a schematic diagram of the mesa M of the VCSEL 10A according to the second exemplary embodiment. d1 denotes a thickness (nm) of the phase adjustment layer 114, and d2 denotes a thickness (nm) of the light absorption layer (contact layer) 130 that is composed of GaAs.

Because the phase adjustment layer 114 influences a reflectivity, it is desirable that the thickness d1 of the phase adjustment layer 114 satisfy a condition represented by Equation (1).

$$d1=(2a-1)\lambda/2n1 \quad (1)$$

Here, a denotes an integer, λ denotes an emission wavelength, and n1 denotes a refractive index of the phase adjustment layer 114. However, as described below, if the thickness d1 is within the range between about ±10% thereof, an FFP indicating a unimodal distribution that is close to a Gaussian distribution can be obtained. Accordingly, preferably, the thickness d1 can be in the range from 0.9d1 to 1.1d1.

It is desirable that the thickness d2 of the light absorption layer 130 satisfy a condition represented by Equation (2) in order to realize phase matching between the light absorption layer 130 and the phase adjustment layer 114.

$$(n2-1)\times d2+(1-n1)\times d1=\lambda\times b \quad (2)$$

Here, b denotes an integer, and n2 denotes a refractive index of the light absorption layer 130.

Figure 7:
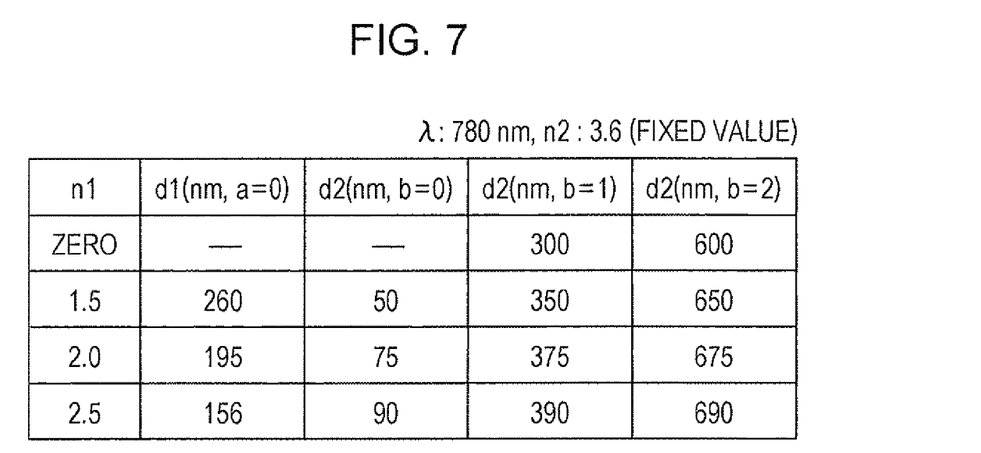
FIG. 7 is a table illustrating the relationships between the refractive index of a phase adjustment layer, and the thickness of the phase adjustment layer and the thickness of a light absorption layer.

FIG. 7 is a table illustrating the relationships between the refractive index n1 of the phase adjustment layer 114, and the thickness d1 of the phase adjustment layer 114 and the thickness d2 of the light absorption layer 130. In calculation for the relationships, 780 nm is used as the emission wavelength λ, and 3.6 is used as the refractive index n2 (the refractive index of the contact layer that is composed of GaAs). Furthermore, each of the integers a and b is a parameter associated with periodicity.

In FIG. 7, when the phase adjustment layer 114 is not formed, the thickness d2 of the light absorption layer 130 that satisfies Equation (2) is 300 nm. The thickness d2 that satisfies the next condition (b=2) is 600 nm. When 1.5 is selected as the refractive index n1 of the phase adjustment layer 114 (for example, when the phase adjustment layer 114 is composed of $SiO_2$ or SiON), the thickness d1 of the phase adjustment layer 114 that first satisfies a condition represented by Equation (1) is 260 nm. The thickness d2 of the light absorption layer 130 that first satisfies a condition represented by Equation (2) is 50 nm. Furthermore, the thickness d2 of the light absorption layer 130 that satisfies the next condition (b=1) represented by Equation (2) is 350 nm. The next thickness d2 is 650 nm.

Next, when the refractive index n1 of the phase adjustment layer 114 is 2.0, the thickness d1 of the phase adjustment layer 114 is 195 nm, and the thickness d2 of the light absorption layer 130 is 75 nm. The thickness d2 of the light absorption layer 130 that satisfies the next condition represented by Equation (2) is 375 nm. The next thickness d2 is 675 nm. Similarly, when the refractive index n1 of the phase adjustment layer 114 is 2.5, the thickness d1 of the phase adjustment layer 114 is 156 nm, and the thickness d2 of the light absorption layer 130 is 90 nm. The thickness d2 of the light absorption layer 130 that satisfies the next condition is 390 nm. The next thickness d2 is 690 nm.

Regarding the phase adjustment layer 114, by selecting the refractive index n1 and the thickness d1, the reflectivity of the central region is optimized, and is adjusted so that the light which emanates from the central region and the light which emanates from the peripheral region have the same phase. In contrast, regarding the light absorption layer 130, it is not necessary to consider the reflectivity of the peripheral region, and the thickness d2 is selected using Equation (2) so that phase matching is realized between the light absorption layer 130 and the phase adjustment layer 114. There are multiple thicknesses d2 that satisfy conditions represented by Equation (2). The flexibility in selection of a thickness as the thickness of the light absorption layer 130 increases. In other words, the relationships between a reflectivity and a phase difference are not uniquely defined, and the reflectivity and the phase difference can be controlled independently from each other.

Figure 8:
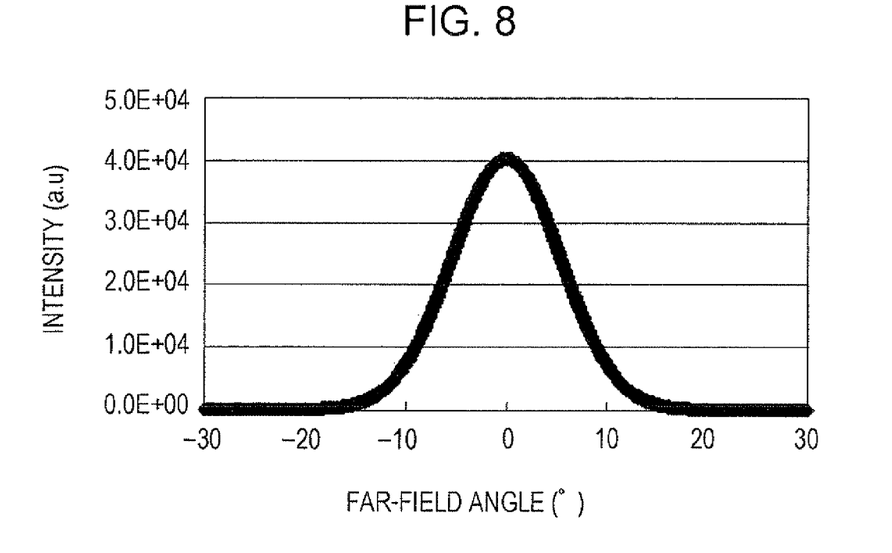
FIG. 8 is a graph illustrating a far field pattern (FFP) in a case in which there is no phase difference of laser light in the present exemplary embodiment.
Figure 9:
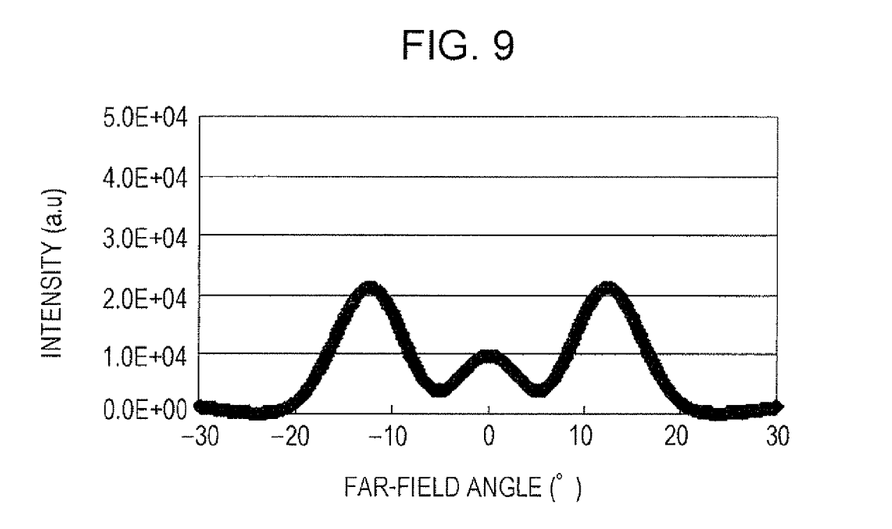
FIG. 9 is a graph illustrating an FFP in a case in which there is a phase difference of laser light.

FIG. 8 illustrates an FFP in a case in which there is no phase difference when the refractive index n1 of the phase adjustment layer 114 is set to 2.0, the thickness d1 of the phase adjustment layer 114 is set to 195 nm, and the thickness d2 of the light absorption layer 130 is set to 75 nm, which are shown in the table illustrated in FIG. 7. FIG. 9 illustrates an FFP in which there is a phase difference when the thickness d1 of the phase adjustment layer 114 is changed to 594 nm. As illustrated in FIG. 8, using the thickness d1 and the thickness d2 that satisfy Equations (1) and (2), the light L2 that is generated by high-order transverse-mode oscillation is reduced. Additionally, because there is no phase difference between the light L1 and the light L2 that are emitted, the FFP indicates a unimodal Gaussian light-intensity distribution.

In contrast, as illustrated in FIG. 9, in a case in which the thickness d1 of the phase adjustment layer 114 does not satisfy Equation (1), even when the light L2 generated by high-order transverse-mode oscillation is reduced by the light absorption layer 130, a phase difference occurs between the light L2 that passes through the light absorption layer 130 and the light L1 that is generated by fundamental transverse-mode oscillation. Side lobes occur on an FFP because of interference caused by the phase difference, and the FFP indicates a multimodal distribution. When laser light having such a multimodal distribution is used as a light source of an image forming apparatus, non-uniformity in light intensity occurs in a formed image, and this is not desirable for practical use.

Figure 10:
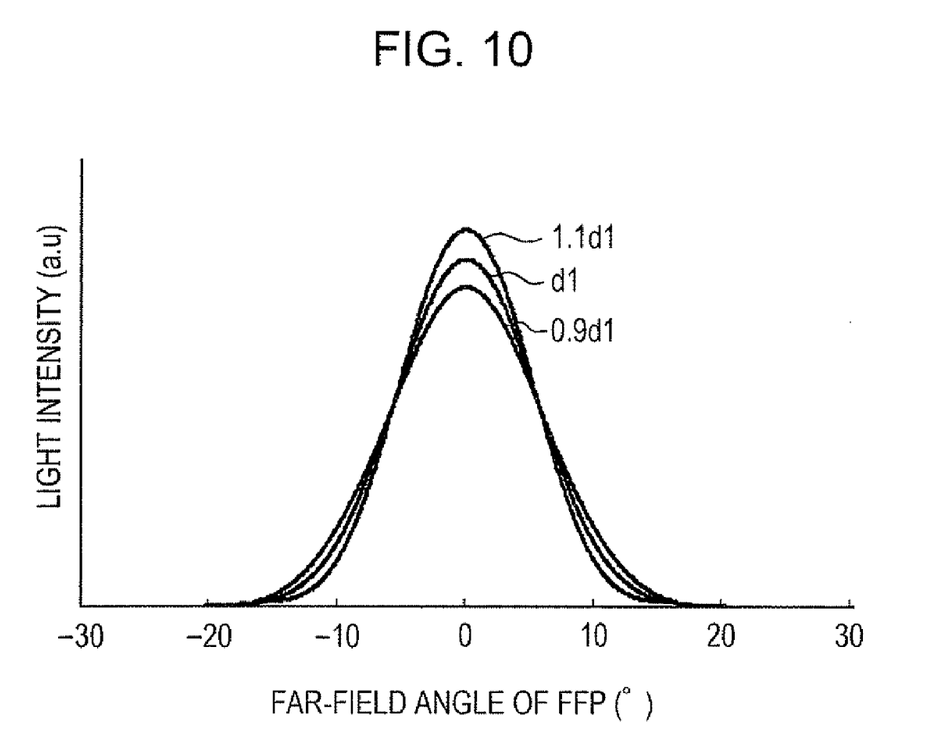
FIG. 10 is a graph illustrating an FFP for explaining an optimum range of the thickness of the phase adjustment layer in the present exemplary embodiment.

FIG. 10 is a graph illustrating the relationships between changes in the thickness of the phase adjustment layer and FFPs. Here, it is supposed that the thickness d1 of the phase adjustment layer 114 is 195 nm as a result of calculation of Equation (1). The thickness of the phase adjustment layer 114 is d1, i.e., 195 nm, an FFP indicating a unimodal distribution can be obtained. When the thickness of the phase adjustment layer 114 is increased to 1.1×d1, i.e., 214.5 nm, the angle of divergence is reduced to some degree, and the light intensity is increased to some degree. However, an FFP indicating a unimodal distribution can still be obtained. Furthermore, when the thickness of the phase adjustment layer 114 is reduced to 0.9×d1, i.e., 175.5 nm, the angle of divergence is increased to some degree, and the light intensity is reduced to some degree. However, an FFP indicating a unimodal distribution can still be obtained. Accordingly, if the thickness d1 of the phase adjustment layer 114 is in the range (175.5 to 214.5 nm) between about ±10% of an optimum value (195 nm), a favorable FFP can be obtained. Even when laser light having such a unimodal distribution is applied as a light source of an image forming apparatus or the like, there is no problem in practical use.

Figure 11A:
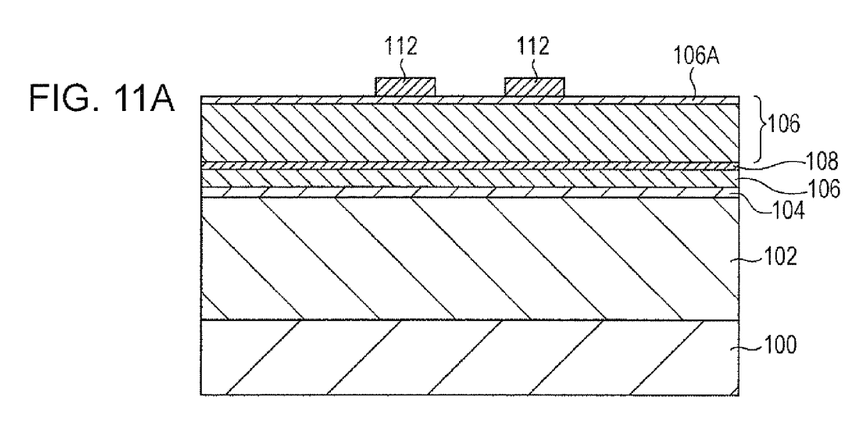
FIGS. 11A to 11C are cross-sectional views for explaining a process of producing the VCSEL according to the first exemplary embodiment of the present invention.

A method for producing the VCSEL according to the first exemplary embodiment of the present invention will be described with reference to FIGS. 11A to 11C. First, as illustrated in FIG. 11A, the n-type lower DBR 102, the active region 104, and the p-type upper DBR 106 are stacked on the n-type GaAs substrate 100 using a metal organic chemical vapor deposition (MOCVD) method. The n-type lower DBR 102 is obtained by alternately stacking an $Al_{0.9}Ga_{0.1}As$ layer and an $Al_{0.3}Ga_{0.7}As$ layer, which have a carrier concentration of $2\times10^{18}$ $cm^{-3}$, forty times so that the thickness of each $Al_{0.9}Ga_{0.1}As$ layer or $Al_{0.3}Ga_{0.7}As$ layer is a quarter of the wavelength of light in a medium. The active region 104 includes a lower spacer layer, which is an undoped $Al_{0.6}Ga_{0.4}As$ layer, an undoped $Al_{0.11}Ga_{0.89}As$ quantum well layer and an undoped $Al_{0.3}Ga_{0.7}As$ barrier layer, and an upper spacer layer that is an undoped $Al_{0.6}Ga_{0.7}As$ layer. The p-type upper DBR 106 is obtained by alternately stacking a p-type $Al_{0.9}Ga_{0.1}As$ layer and a p-type $Al_{0.3}Ga_{0.7}As$ layer, which have a carrier concentration of $3 \times 10^{18}$ cm$^{-3}$, twenty-four times so that the thickness of each $Al_{0.9}Ga_{0.1}As$ layer or $Al_{0.3}Ga_{0.7}As$ layer is a quarter of the wavelength of light in a medium. The contact layer 106A that is a p-type GaAs layer having a carrier concentration of $1 \times 10^{19}$ cm$^{-3}$ is formed as the top layer of the upper DBR 106. The current confinement layer 108 that is a p-type AlAs layer is formed as the bottom layer of the upper DBR 106 or formed inside of the upper DBR 106. A buffer layer may exist between the substrate 100 and the lower DBR 102 although the buffer layer is not provided by way of example here.

Next, the light absorption layer 112 is formed on the contact layer 106A. The light absorption layer 112 is composed of a semiconductor material that is doped with a p-type impurity, and has an etching selectivity with respect to the contact layer 106A. Furthermore, the thickness d2 of the light absorption layer 112 is obtained using Equation (2) described above. Next, the light absorption layer 112 is etched by a commonly known photolithography process, thereby forming the ring-shaped light absorption layer 112 on the contact layer 106A. In this case, the contact layer 106A functions as an etching stopper layer.

Figure 11B:
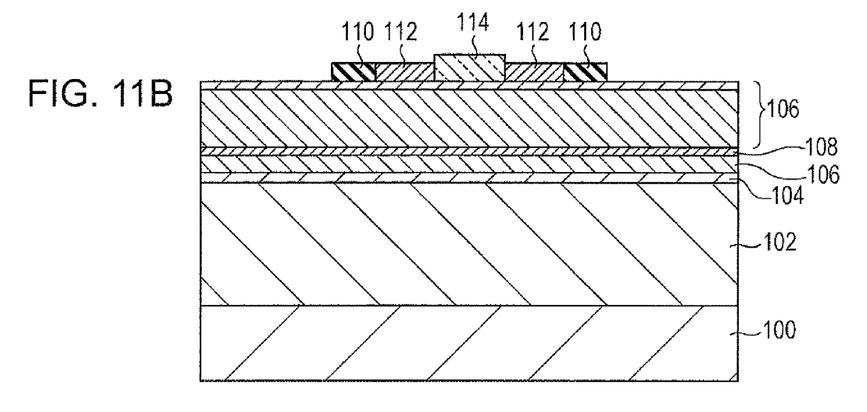

Next, as illustrated in FIG. 11B, the ring-shaped p-side electrode 110 is formed by a lift-off process. Then, the phase adjustment layer 114 is formed on the contact layer 106A that is exposed using the light absorption layer 112. An order reverse to this order may be used. The p-side electrode 110 may be formed after the phase adjustment layer 114 is formed.

Figure 11C:
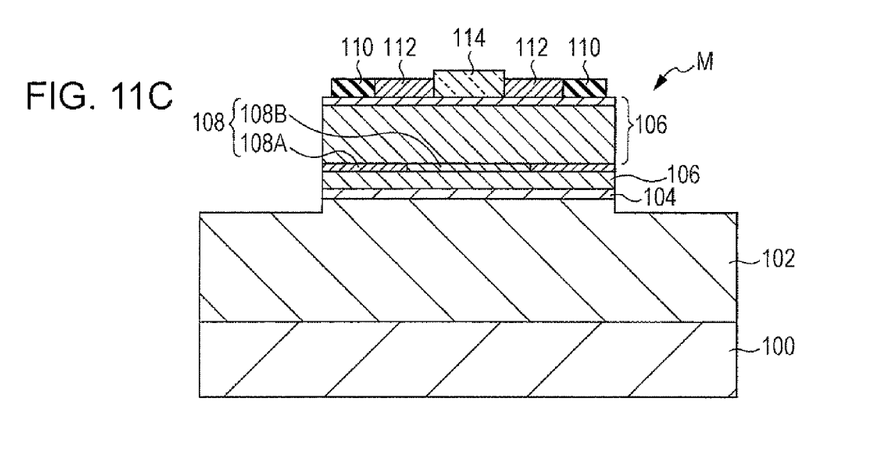

Next, as illustrated in FIG. 11C, a mask for etching that has a circular shape is formed on a region including the p-side electrode 110, the light absorption layer 112, and the phase adjustment layer 114. For example, the semiconductor layers starting with the upper DBR 106 ending with one portion of the lower DBR 102 is etched by reactive-ion etching, for example, in which boron trichloride is used as an etching gas, thereby forming the mesa M having a cylindrical shape. Then, an oxidation process is performed, thereby forming the current confinement layer 108 including the oxidized region 108A. The diameter of the electrically conductive region 108B is controlled in the oxidation process so that the size of the diameter will be a size (for example, 3 µm) larger than the size of a diameter which is necessary for single transverse-mode oscillation, and will be a size of a diameter with which high-order transverse-mode oscillation can be generated, e.g., about 5 µm. Thereinafter, the mask is removed, a pattern of the interlayer insulating film 116 is formed all over the substrate 100, and the n-side electrode 120 is formed on the rear face of the substrate 100.

Next, a method for producing the VCSEL according to the second exemplary embodiment of the present invention will be described with reference to FIGS. 12A to 12C.

Figure 12A:
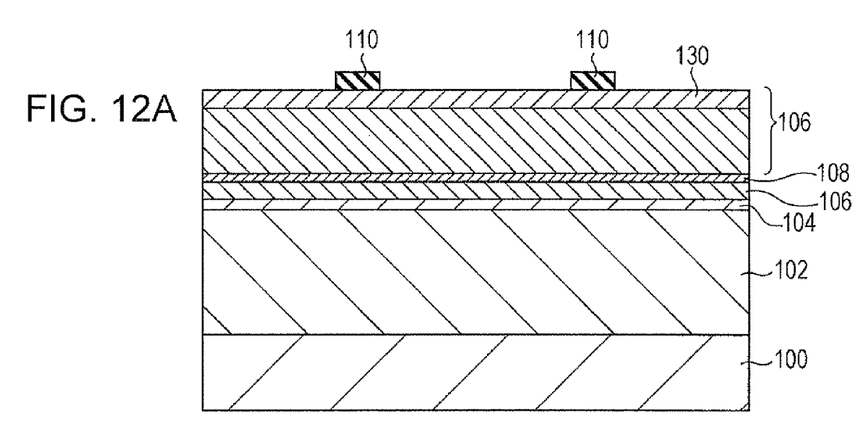
FIGS. 12A to 12C are cross-sectional views for explaining a process of producing the VCSEL according to the second exemplary embodiment of the present invention.

In FIG. 12A, as in the case illustrated in FIG. 11A, the lower DBR 102, the active region 104, and the upper DBR 106 are formed on the substrate 100. The light absorption layer 130 also serving as a contact layer is formed as the top layer of the upper DBR 106. Next, the ring-shaped p-side electrode 110 is formed on the light absorption layer 130 by a lift-off process.

Figure 12B:
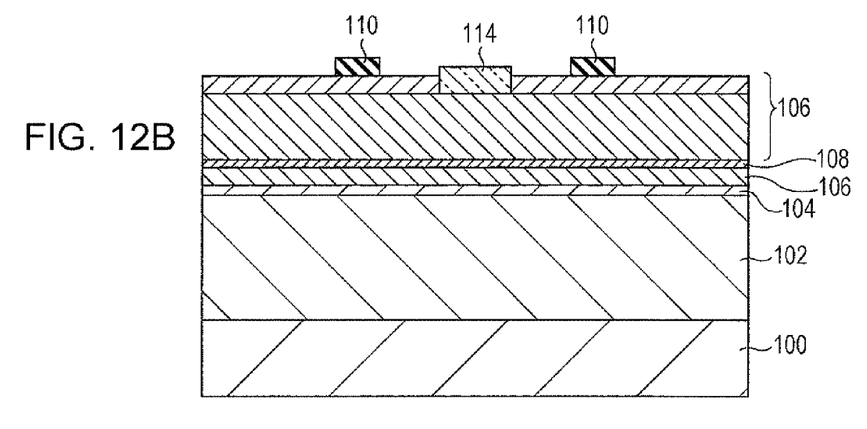
Figure 12C:
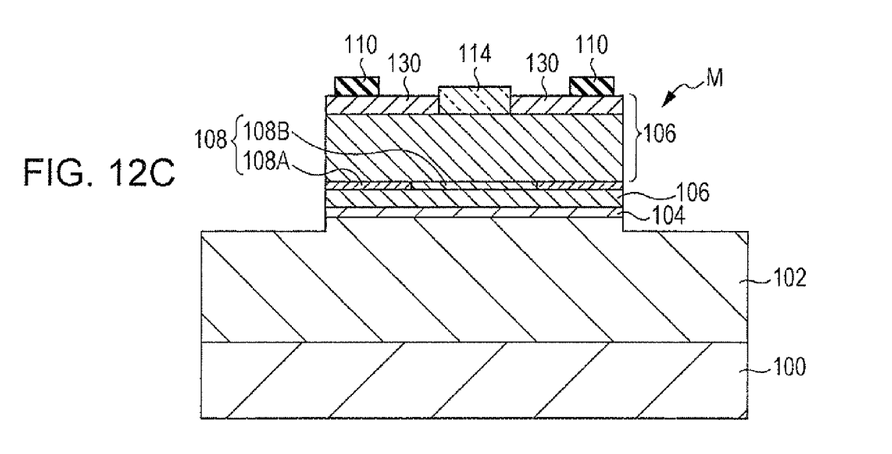

Next, as illustrated in FIG. 12B, a mask for etching, which is not illustrated, is formed. A region of the light absorption layer 130 in the vicinity of the optical axis is etched utilizing the mask. In this case, if an etching stopper layer is formed immediately below the light absorption layer 130 as described in the fourth exemplary embodiment, etching can be stopped by the etching stopper layer. After the mask is removed, a semiconductor layer that is to be a phase adjustment layer 114 is formed on the light absorption layer 130. Patterning is subjected to the semiconductor layer, thereby forming the phase adjustment layer 114. A process thereafter, which is illustrated in FIG. 12C, is performed in a manner similar to the manner in the first exemplary embodiment.

Figure 13A:
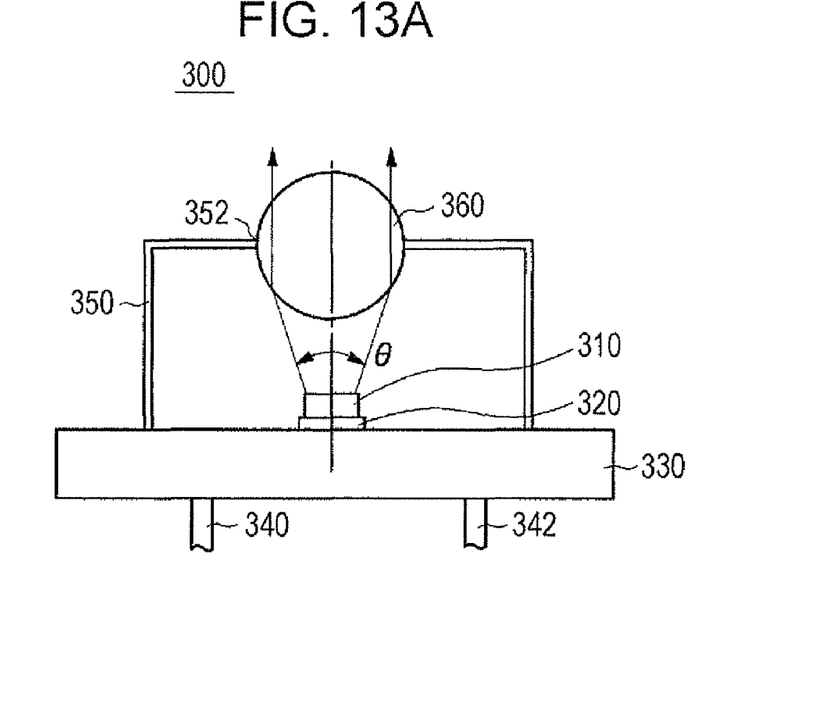
FIGS. 13A and 13B are schematic cross-sectional views illustrating configurations of VCSEL devices in which the VCSEL according to the present exemplary embodiment and an optical member are implemented.

A VCSEL device, an optical information processing apparatus, and an optical transmission apparatus, each of which utilizes the VCSEL according to the present exemplary embodiment, will be described with reference to FIGS. 13A and 13B and FIGS. 14 and 15. FIG. 13A is a schematic cross-sectional view illustrating a configuration of a VCSEL device in which the VCSEL and an optical member are implemented (packaged). A VCSEL device 300 fixes a chip 310, in which the VCSEL is formed, on a disk-shaped metallic stem 330 via an electrically conductive adhesive 320. Leads 340 and 342 that are electrically conductive are inserted into through holes (not illustrated) that are formed in the stem 330. The lead 340, which is one of the two leads, is electrically connected to an n-side electrode of the VCSEL, and the lead 342, which is the other lead, is electrically connected to a p-side electrode of the VCSEL.

A rectangular hollow cap 350 is fixed on the stem 330 including the chip 310. A ball lens 360 that is an optical member is fixed in an opening 352 that is provided at the center of the cap 350. The optical axis of the ball lens 360 is positioned so as to almost coincide with the center of the chip 310. When a forward voltage is applied between the leads 340 and 342, laser light is emitted from the chip 310 in the vertical direction. The distance between the chip 310 and the ball lens 360 is adjusted so that the ball lens 360 is included in a region corresponding to an angle θ of divergence of the laser light emitted from the chip 310. Furthermore, a light receiving element or a temperature sensor for monitoring a light emission state of the VCSEL may be included in the cap 350.

Figure 13B:
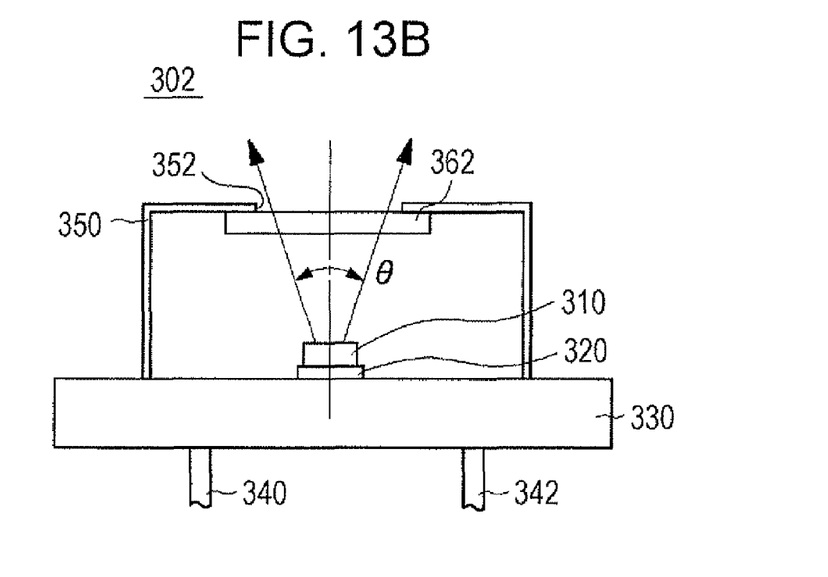

FIG. 13B is a diagram illustrating a configuration of another VCSEL device. A VCSEL device 302 illustrated in FIG. 13B fixes a plate glass 362 in the opening 352 that is provided at the center of the cap 350, instead of using the ball lens 360. The center of the plate glass 362 is positioned so as to almost coincide with the center of the chip 310. The distance between the chip 310 and the plate glass 362 is adjusted so that the diameter of an opening of the plate glass 362 is equal to or larger than a distance corresponding to the angle θ of divergence of the laser light emitted from the chip 310.

Figure 14:
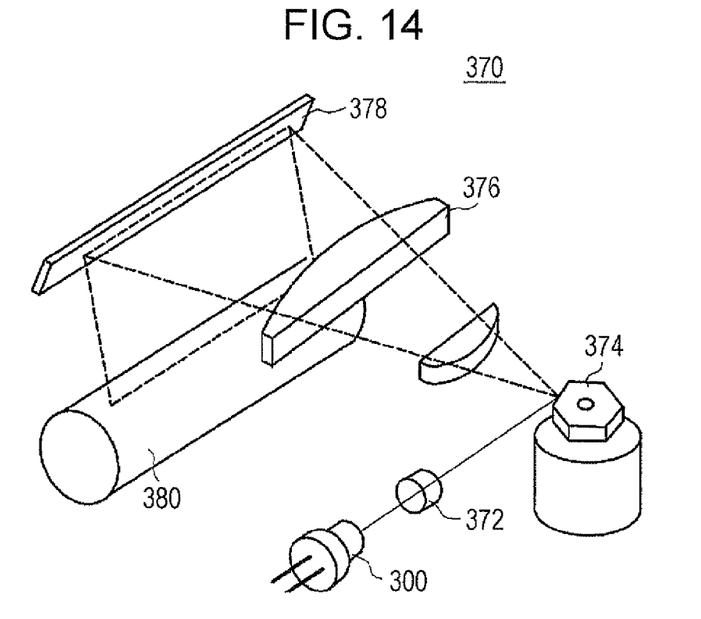
FIG. 14 is a diagram illustrating an example of a configuration of a light information processing apparatus in which the VCSEL according to the present exemplary embodiment is used as a light source.

FIG. 14 is a diagram illustrating an example in which the VCSEL is applied as a light source of an optical information processing apparatus. An optical information processing apparatus 370 includes a collimator lens 372, a polygon mirror 374, an fθ lens 376, a reflection mirror 378, and a photoconductor drum (recording medium) 380. Laser light emitted from the VCSEL device 300 or 302 in which the VCSEL is implemented as illustrated in FIG. 13A or 13B enters the collimator lens 372. The polygon mirror 374 rotates at a fixed speed, and reflects, at a fixed angle of divergence, a pencil of light rays supplied from the collimator lens 372. Laser light emitted from the polygon mirror 374 enters the fθ lens 376, and the fθ lens 376 irradiates the reflection mirror 378 with the laser light. The reflection mirror 378 has a line shape. The photoconductor drum (recording medium) 380 forms a latent image on the basis of light reflected by the reflection mirror 378. As described above, the VCSEL can be utilized as a light source of an optical information processing apparatus, such as a copier or a printer including an optical system that gathers laser light, which is emitted by the VCSEL, on a photoconductor drum, and a mechanism that scans the gathered laser light on the photoconductor drum.

Figure 15:
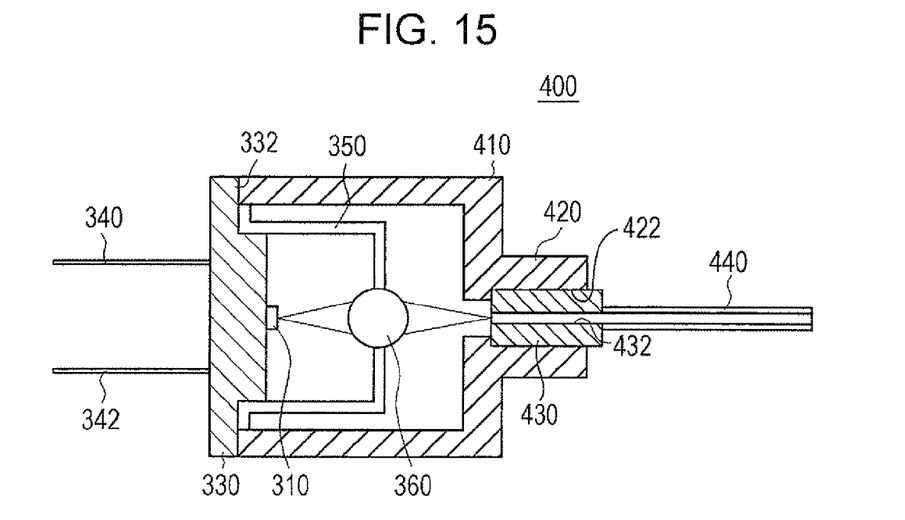
FIG. 15 is a schematic cross-sectional view illustrating a configuration of an optical transmission apparatus in which the VCSEL device illustrated in FIG. 13A is used.

FIG. 15 is a schematic cross-sectional view illustrating a configuration in a case in which the VCSEL device illustrated in FIG. 13A is applied in an optical transmission apparatus. An optical transmission apparatus 400 includes a housing 410, a sleeve 420, a ferrule 430, and an optical fiber 440. The housing 410 is fixed in the stem 330, and has a cylindrical shape. The sleeve 420 is formed on the end face of the housing 410 so that the sleeve 420 and the housing 410 are formed as one piece. The ferrule 430 is held in an opening 422 of the sleeve 420. The optical fiber 440 is held by the ferrule 430. An end portion of the housing 410 is fixed to a flange 332 that is formed in the stem 330 in the circumferential direction. The ferrule 430 is accurately positioned in the opening 422 of the sleeve 420. The optical axis of the optical fiber 440 is made to match with the optical axis of the ball lens 360. A core wire of the optical fiber 440 is held in a through hole 432 of the ferrule 430.

Laser light emitted from the surface of the chip 310 is gathered by the ball lens 360. The gathered light enters the core wire of the optical fiber 440, and transmitted. Although the ball lens 360 is used in the above-described example, a lens other than a ball lens, such as a double-convex lens or a plano-convex lens, may be used. Furthermore, the optical transmission apparatus 400 may include a driving circuit for applying electric signals to the leads 340 and 342. Moreover, the optical transmission apparatus 400 may include a reception function for receiving a light signal via the optical fiber 440.

As described above, the exemplary embodiments of the present invention are described. However, the present invention is not limited to a specific exemplary embodiment. Various changes and modifications may be made without departing from the gist of the present invention described in claims. For example, in the exemplary embodiments described above, a mesa having a circular shape is provided by way of example. However, the shape of a mesa is not limited thereto. The mesa may have an ellipsoidal shape or a rectangular shape. Furthermore, in the exemplary embodiments described above, AlGaAs compound semiconductors are provided by way of examples. However, VOSELs in which other group III-V compound semiconductors are used may be provided. Moreover, in the exemplary embodiments described above, a current confinement layer of the selective oxidation type is provided by way of example. However, a current confinement layer of a proton bombardment type or of an air-post type may be used. Additionally, a layer composed of GaInP is provided by way of example of the etching stopper layer. However, the material that the etching stopper layer is composed of is not limited thereto. Other electrically conductive materials having etching selection ratios may be used.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A vertical cavity surface emitting laser comprising:
   a substrate;
   a first semiconductor multilayer film reflector of a first conductivity type, the first semiconductor multilayer film reflector being formed on the substrate;
   an active region that is formed on the first semiconductor multilayer film reflector;
   a second semiconductor multilayer film reflector of a second conductivity type that is a conductivity type different from the first conductivity type, the second semiconductor multilayer film reflector being formed on the active region, and the second semiconductor multilayer film reflector including a first surface facing the active region and a second surface opposite to the first surface;
   an electrode which is formed on the second surface of the second semiconductor multilayer film reflector, and in which a light emitting aperture from which light is emitted is formed;
   a solid light absorption layer that is formed on the second surface of the second semiconductor multilayer film reflector in at least a peripheral region of the light emitting aperture of the electrode, and that absorbs light having an emission wavelength; and
   a light transmission layer that is composed of a material which the light having the emission wavelength is able to pass through, and that is formed on the second surface of the second semiconductor multilayer film reflector in a central region of the light emitting aperture of the electrode,
   wherein a thickness of the light absorption layer and a thickness of the light transmission layer are selected so that a phase of light which emanates from the light absorption layer and a phase of light which emanates from the light transmission layer are adjusted.

2. The vertical cavity surface emitting laser according to claim 1, wherein the thickness of the light transmission layer is in a range between about ±10% of d1 that is obtained using an equation $d1=(2a-1)\lambda/2n1$ where a is an integer, $\lambda$ is an emission wavelength, and n1 is a refractive index.

3. The vertical cavity surface emitting laser according to claim 1, wherein a thickness d2 of the light absorption layer in a case in which the light absorption layer is formed in the peripheral region other than the central region satisfies a condition represented by an equation $(n2-1)\times d2+(1-n1)\times d1=\lambda\times$ where b is an integer and n2 is a refractive index.

4. The vertical cavity surface emitting laser according to claim 1,
   wherein the light absorption layer includes a semiconductor layer having an impurity concentration which is higher than an impurity concentration of a high-refractive-index layer and a low-refractive-index layer that are included in the second semiconductor multilayer film reflector, and
   wherein the electrode is electrically connected to the light absorption layer.

5. The vertical cavity surface emitting laser according to claim 1, wherein the light absorption layer includes a layer that has a thickness smaller than a thickness of the light absorption layer in the peripheral region, and that is provided between the light transmission layer and the second semiconductor multilayer film reflector.

6. The vertical cavity surface emitting laser according to claim 1, wherein the vertical cavity surface emitting laser further comprises an etching stopper layer that is provided between the light absorption layer and an additional light absorption layer, or between the light absorption layer and the second semiconductor multilayer film reflector, and that has an etching selection ratio with respect to the light absorption layer.

7. The vertical cavity surface emitting laser according to claim 1, wherein the light absorption layer is covered with a protective film.

8. The vertical cavity surface emitting laser according to claim 1,
wherein a columnar structure extending from the second semiconductor multilayer film reflector to the first semiconductor multilayer film reflector is formed,
wherein, in the columnar structure, a current confinement layer that includes an oxidized region which is oxidized from a side wall of the columnar structure, and an electrically conductive region the periphery of which is defined by the periphery of the oxidized region is formed, and
wherein the light absorption layer is formed so that an inside diameter of the light absorption layer is smaller than a diameter of the electrically conductive region.

9. The vertical cavity surface emitting laser according to claim 8, wherein a diameter of the electrically conductive region is about five micrometers or larger.

10. A vertical-cavity-surface-emitting-laser device comprising:
the vertical cavity surface emitting laser according to claim 1; and
an optical member that light emitted from the vertical cavity surface emitting laser enters.

11. An optical transmission apparatus comprising:
vertical-cavity-surface-emitting-laser device according to claim 10; and
a transmission unit that transmits, via an optical medium, laser light emitted from the vertical-cavity-surface-emitting-laser device.

12. An information processing apparatus comprising:
the vertical cavity surface emitting laser according to claim 1;
a light gathering unit that gathers, onto a recording medium, laser light which is emitted from the vertical cavity surface emitting laser; and
a mechanism that scans the laser light, which has been gathered by the light gathering unit, on the recording medium.

* * * * *